United States Patent [19]
Upadhyayula et al.

[11] 3,955,158
[45] May 4, 1976

[54] MICROWAVE DELAY LINE

[75] Inventors: Lakshminarasimha Chainulu Upadhyayula, East Windsor; Markus Nowogrodzki, Sussex, both of N.J.

[73] Assignee: RCA Corporation, New York, N.Y.

[22] Filed: Feb. 27, 1974

[21] Appl. No.: 446,418

[52] U.S. Cl. .............................. 333/29; 333/30 R; 333/80 R
[51] Int. Cl.² ..................... H03H 7/44; H03H 9/00; H04B 3/18
[58] Field of Search .............. 333/31 R, 30 R, 29, 333/80 R, 80 T; 331/107 G; 357/57

[56] References Cited
UNITED STATES PATENTS 3,755,621  8/1973  Dillenburger et al. ............. 333/30 R
3,832,652  8/1974  Upadhyayula et al. .......... 331/107 G Primary Examiner—Alfred E. Smith
Assistant Examiner—Marvin Nussbaum
Attorney, Agent, or Firm—Edward J. Norton; Robert M. Rodrick; Joseph D. Lazar

[57] ABSTRACT

A predetermined delay is provided for a microwave input signal by a delay line having a frequency divider circuit including a negative resistance semiconductor device responsive to the microwave input signal and a D.C. bias voltage. The frequency divider circuit converts the input signal at frequency $f_1$, to a signal at a frequency, $f_2$, within the operating range of an acoustic delay device coupled to the frequency divider circuit. A frequency multiplier circuit coupled to the acoustic delay device multiplies the frequency, $f_2$, of the delayed signal from the acoustic device to the frequency, $f_1$, of the input signal.

6 Claims, 3 Drawing Figures

MICROWAVE DELAY LINE

The invention herein disclosed was made in the course of or under a contract or subcontract thereunder with the Department of the Air Force.

CROSS-REFERENCES TO RELATED APPLICATIONS

The following copending applications assigned to the same assignee as the present application are of interest: "Dynamic Dividing Circuit", U.S. Ser. No. 325,071, filed Jan. 19, 1973, by S. Y. Narayan and "Dynamic Dividing Circuit", now U.S. Pat. No. 3,832,651, and U.S. Ser. No. 325,072, filed Jan. 19, 1973, by S. Y. Narayan and C. L. Upadhyayula, now U.S. Pat. No. 3,832,652.

BACKGROUND OF THE INVENTION

1. FIELD OF THE INVENTION

The present invention relates to microwave delay lines and more particularly to microwave delay lines having a frequency divider circuit.

2. DESCRIPTION OF THE PRIOR ART

In the past, acoustic delay devices have been used in microwave delay lines for providing a predetermined delay for microwave signals. Acoustic delay devices are useful in microwave delay lines since they are capable of providing relatively long signal delays per unit length of acoustic material. However, prior art acoustic delay devices are not operable beyond an upper frequency limit determined by critical acoustic device dimensions.

A prior art solution to the problem of providing a delay for a signal at a frequency exceeding the upper operating frequency of an acoustic delay device is to reduce the frequency of the input signal by use of a frequency down-converter. As known in the art, a frequency down-converter is a circuit having a semiconductor device, with a non-linear current-voltage characteristic, arranged to mix a first signal or input signal at frequency $f_1$, with a second signal or local oscillator (L.O.) signal at frequency $f_2$. The resulting down-converter output signal or intermediate frequency (I.F.) signal is at frequency $f_3$, or that frequency which is the difference between $f_1$ and $f_2$. However, in addition to a difference signal at frequency $f_3$, down-converters also generate undesired spurious signals resulting from cross modulation which interfere with information carrying input signals.

In addition, prior art frequency dividers of the type described above are not suitable for producing an output signal free from undesired noise or amplitude modulation which may be present in a frequency modulated input signal coupled to the frequency divider. Also, it will be appreciated that for certain delay line applications where space and operating efficiency are critical, the additional power requirements for a local oscillator signal source and the complicated, space consuming, circuitry associated with a frequency down-converter are undesirable.

In the past, frequency division circuits have been limited in capability by semiconductor device constraints. In particular, most logic circuitry has been constructed using silicon semiconductor devices. This has limited the speed of the devices as a result of the electron mobility in silicon and the required electric field for obtaining velocity saturation in silicon.

It has been learned that some semiconductors such as gallium arsenide, indium phosphide and other III-V compounds have a much higher electron mobility than silicon, while requiring a much lower electric field for obtaining electron velocity saturation compared to silicon. Consequently, such devices have a lower delay-dissipation product than do silicon devices. Furthermore, gallium arsenide can be obtained in a semi-insulating form which has excellent dielectric properties even at high microwave frequencies. This means that semiconducting gallium arsenide can be grown homo-epitaxially upon semi-insulating gallium arsenide with no lattice mismatch problems.

In addition to the general advantages of certain III-V compounds such as gallium arsenide over silicon as a semiconductor, there is a physical phenomenon which exists in these compounds but not in silicon which may be used for high speed logic applications. This phenomenon is such that when there is applied in a body of the material an electric field higher than a threshold value determined by the material, a high field domain is formed in the material and travels through the body under the influence of the applied voltage to result in a temporary decrease in current flow through the body. The effect is commonly referred to as the transferred electron effect. Devices that take advantage of the transferred electron effect are called "Gunn-effect" or transferred electron devices (TED's). TED's are two-valley bulk devices and not junction devices. Therefore, TED's do not suffer from speed limitations due to junction capacitance.

The structure and operation of two-valley devices are described in detail in a series of papers in the January 1966 issue of the IEEE Transactions on Electron Devices, Vol. Ed-13, No. 1. As is set forth in these papers, a negative resistance can be obtained from a bulk semiconductor wafer of substantially homogeneous constituency having two energy band minima within the conduction band which are separated by only a small energy difference. By establishing a suitably high electric field across opposite ohmic contacts of the semiconductor wafer, oscillations can be induced which result from the formation of discrete regions of high electric field intensity and corresponding space-charge accumulation, called domains, that travel from the negative to the positive contact at approximately the carrier drift velocity. A characteristic of the two-valley semiconductor material is that it presents a negative differential resistance to internal currents in regions of high electric field intensity. Hence, the electric field intensity of the domain grows as it travels toward the positive electrode.

Solid state oscillators of the "Gunn-effect" type have attracted widespread attention due to their small size and low cost as compared to other available microwave oscillator arrangements, e.g., klystrons, magnetrons, traveling wave tubes, etc. Essentially, such oscillators comprise a small specimen of particular semiconductive material having a multivalley conduction band system and capable of generating current oscillations in the microwave range when subjected to electric fields in excess of a critical, or threshold, intensity $E_T$. According to the present theory, a high electric field region, or domain, forms within the semiconductive specimen when subjected to electric fields in excess of a critical intensity $E_T$ due to a redistribution of electric fields within the specimen. Such redistribution of electric fields results from a transfer of charge carriers from a high mobility conduction band to a low mobility conduction band under the influence of applied electric fields in excess of the critical intensity $E_T$. A domain, when nucleated, is sustained and propagated along the semiconductive specimen by electric fields greater than a sustaining intensity $E_S$, which is less than the critical intensity $E_T$. The presence of a domain has the effect of reducing the overall conductance of the semiconductive specimen; the magnitude of current flow through the semiconductive specimen varies according to the presence and absence of a domain. Accordingly, a constant voltage of particular magnitude applied across the semiconductive specimen is effective to nucleate and propagate domains in successive, or cyclic, fashion whereby current through such specimen and, hence, along a series-connected load varies periodically in the form of coherent current oscillations. The theory of the "Gunn-effect" has been described more fully in "Theory of Negative-Conductance Amplification and of Gunn Instabilities in 'Two-Valley' Semiconductor" by D. E. McCumber et al., IEEE Transactions of Electron Devices, Vol. ED-13, No. 1, January 1966.

The frequency of current oscillations generated by oscillators of the "Gunn-effect" type operated in the travelng domain, or transit-time, mode depends upon the device length L and propagation velocity $v$ of the domains along the active region, i.e., v/L, where $v$ is about $10^7$ cm/sec. There is a further requirement for traveling domain oscillations in n-type gallium-arsenide that the product of the ionized donor density, no, and the device length, L, exceed $10^{12}$cm$^{-2}$.

Heretofore, TED's have been used in circuits in which they have been supplied with direct current and have provided a microwave frequency output characteristic of the particular TED dimensions as disclosed in U.S. Pat. No. 3,365,583 to J. B. Gunn, and they have been used in amplifier circuits where they are supplied with an input whose frequency is the same as the characteristic frequency of the TED.

TED's have also been used in logic circuits, primarily as comparators. With regard to logic applications of TED's reference may be made to U.S. Pat. No. 3,594,618 issued to H. L. Hartnagel, "Theory of Gunn effect logic", Solid-State Electronics, Vol. 12, pp. 19–30, 1969; to Toshiya Hayashi, "Three-terminal GaAs Switches", IEEE Elec. Dev., Vol. ED-15, No. 2, pp. 105–110, February 1968; and to T. Sugeta, H. Yanai, and K. Sekido, "Schottky Gate Bulk Effect Digital Devices", Proc. IEEE (Letters) Vol. 59, No. 11, pp. 1629–1630, November 1971.

SUMMARY OF THE INVENTION

According to the invention a delay line is provided which includes a frequency divider means having a semiconductor device exhibiting a negative resistance current-voltage characteristic in response to both a D.C. bias signal and a microwave input signal at input frequency $f_1$. The device converts the input signal to an output signal at a frequency, $f_2$, subharmonically related to frequency $f_1$. Coupling means couple the frequency divider output signal to an acoustic delay device which provides a predetermined delay for the frequency divider output signal. A frequency multiplier means is coupled to the acoustic delay device for multiplying the frequency of the delayed signal from frequency $f_2$ to the frequency, $f_1$, of the microwave input signal.

DESCRIPTION OF THE PREFERRED EMBODIMENT

Figure 1:
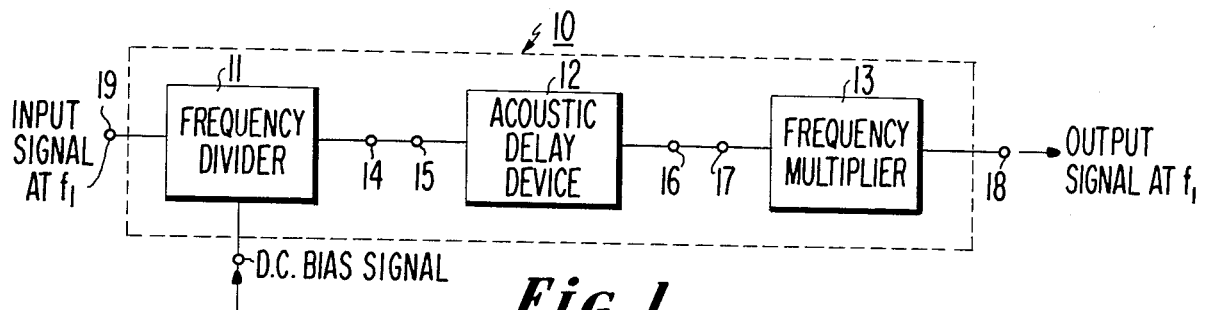
FIG. 1 is a block diagram of a delay line according to the invention.

Referring to FIG. 1, there is shown a block diagram of a delay line 10 according to the invention, comprising frequency divider circuit 11, acoustic delay device 12 and frequency multiplier 13. Delay line 10 is arranged to provide a predetermined delay for input signals. Acoustic delay device 12 is a prior art device having a transducer, for converting electromagnetic signals to acoustic signals, coupled to acoustic signal transmission material capable of providing a relatively long delay for inpput signals. Two port acoustic devices suitable for delay line application according to the present invention are described in an article entitled "Surface Acoustic Waves: New Processing Tools for EW" by D. A. Gandolfo et al published in Microwaves, October 1971. However, such a prior art acoustic delay device 12 is not operable beyond an upper frequency limit determined by critical acoustic device dimensions such as transducer thickness. Thus, according to the invention, the frequency limitation is overcome by frequency divider circuit 11. Circuit 11 has two ports or input and ports 19 and output 14, respectively, and includes a three or two terminal "Transfer Electron Device" (TED) having a negative resistance current-voltage characteristic for converting an input signal at a relatively high microwave frequency, $f_1$, to an output signal at a lower frequency, $f_2$, subharmonically related to $f_1$. The TED is chosen to provide an output signal having an output frequency, $f_2$, with the operating bandwidth of acoustic delay device 12. Prior art frequency dividers provide an output signal having noise or amplitude modulation which is present in the frequency divider input signal. Divider circuit 11 is arranged according to the invention to operate over a relatively wide instantaneous frequency bandwidth in response to both a microwave input signal and a D.C. bias signal, as further described below, to provide an output signal relatively free of undesired noise or amplitude modulation. Thus, divider circuit 11 is suitable for operating on a frequency modulated input signal for providing a frequency modulated output signal relatively free of undesired noise or amplitude modulation which may be included as part of the frequency modulated input signal. The frequency, $f_2$, of the divider 11 output signal is:

$$f_2 = f_1/n \qquad (1)$$

where $f_1$ is the frequency of the input signal and $n$ is an integer including one.

It should be noted that frequency divider circuit 11 functions without the requirement of a local oscillator (L.O.) signal. The frequency divider circuit output signal from divider output port 14 is coupled to input port 15 of acoustic delay device 12 arranged to provide a predetermined delay for signals at frequency $f_2$. The delayed output signal from output port 16 of delay device 12 is coupled to input port 17 of a suitable frequency multiplier circuit arranged to provide an output signal at the same frequency as input signal frequency $f_1$. If necessary, a suitable amplifier circuit, not shown, may be coupled to multiplier output terminal 18 for compensating for signal transmission loss between divider circuit input port 19 and multiplier output terminals.

Figure 2:
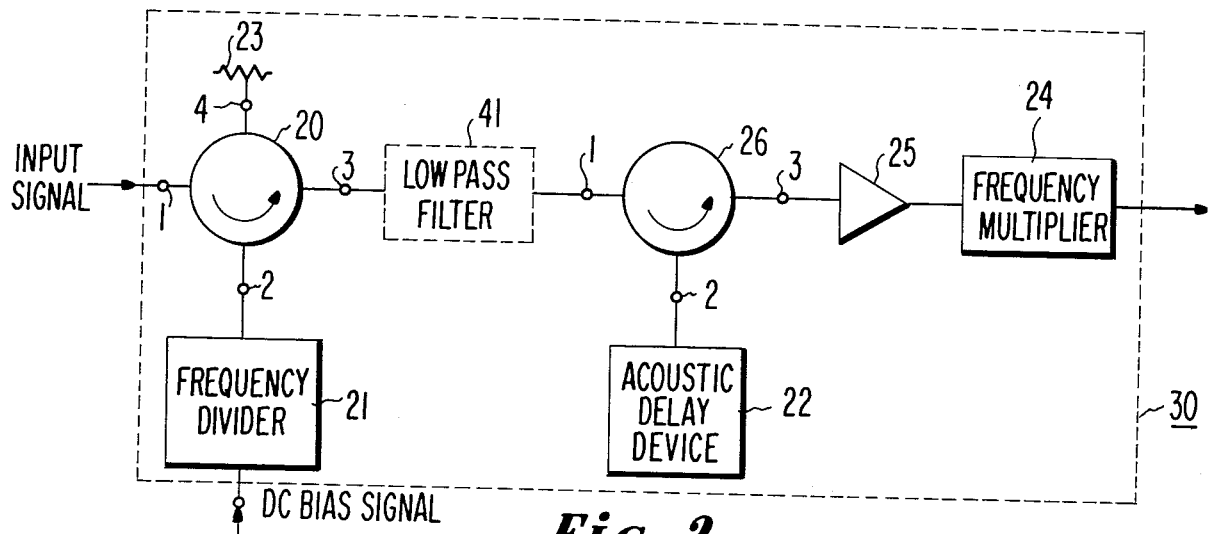
FIG. 2 is a schematic diagram of a delay line according to a preferred embodiment of the invention.

Referring to FIG. 2, there is shown a schematic diagram of a preferred embodiment of delay line 30 according to the invention utilizing single port frequency divider 21 and acoustic delay device 22. An input signal, centered at input frequency, $f_1$, is coupled to port 1 of four port circulator 20 arranged to provide a non-reciprocal conductive path from port 1 to frequency divider circuit 21 terminating port 2 of circulator 20. The input signal may be continuous wave or pulsed and at a fixed frequency or frequency modulated. Frequency divider circuit 21 includes a negative resistance semiconductor device arranged, as further described in FIG. 3, to convert the input signal frequency $f_1$, to a signal at a lower frequency $f_2$, and to reflect the lower frequency signal $f_2$ back to port 2 of circulator 20. The frequency divider output signal at frequency $f_2$ is subharmonically related to frequency $f_1$ and is within the operating bandwidth of a suitable one port bulk wave acoustic delay device 22, which, in turn, terminates port 2 of circulator 26. An example of a one port bulk wave acoustic delay device is described in "Bulk Acoustic Delay Lines Utilizing Sub-micron Platelet $LiN_bO_3$ Transducer" by H. C. Huang et al published in the Digest of the International Electron Device Meeting, pp. 263–265, December 1973. The function of acoustic delay device 22 in delay line 30 will be further described below. The previously mentioned frequency divider output signal reflected back to port 2 of circulator 20 is transmitted along a non-reciprocal conductive path from port 2 to port 3 of circulator 20. Reflected or other delay line generated spurious signals capable of interfering with the input signal at port 1 of circulator 20 are transmitted along a non-reciprocal conductive path from port 3 of circulator 20 to a signal absorbing load 23 terminating port 4 of circulator 20. Thus, frequency divider output signals leaked from port 2 to port 4 of circulator 20 are attenuated by absorber 23.

Port 1 of circulator 26 is coupled to port 3 of circulator 20 for providing a non-reciprocal conductive path for frequency divider output signals to the previously mentioned one port delay device 22 terminating port 2 of circulator 26. If needed, a low pass filter 41 may be coupled between port 3 of circulator 20 and port 1 of circulator 26. The cut-off frequency of filter 41 is chosen to prevent transmission of signals at the input frequency, $f_1$ to delay device 22. Delay device 22 is arranged to provide a delay for signals within its operating bandwidth and then reflect the delayed signals back to port 2 of circulator 26. The delayed output signal from delay device 22 is transmitted along a non-reciprocal conductive path from port 2 to suitable amplifier 25 terminating port 3 of circulator 26. Amplifier 25 is arranged to have a gain characteristic which compensates for various delay line circuit transmission losses such as those associated with delay device 22.

The output signal from amplifier 25 is coupled to a suitable prior art frequency multiplier circuit 24 arranged to provide an output signal at the same frequency, $f_1$, as the input signal. An example of a suitable frequency multiplier circuit 24 is described in "Frequency Translator Circuit", U.S. Pat. No. 3,731,180 issued to L. S. Napoli et al., on May 1, 1973.

Figure 3:
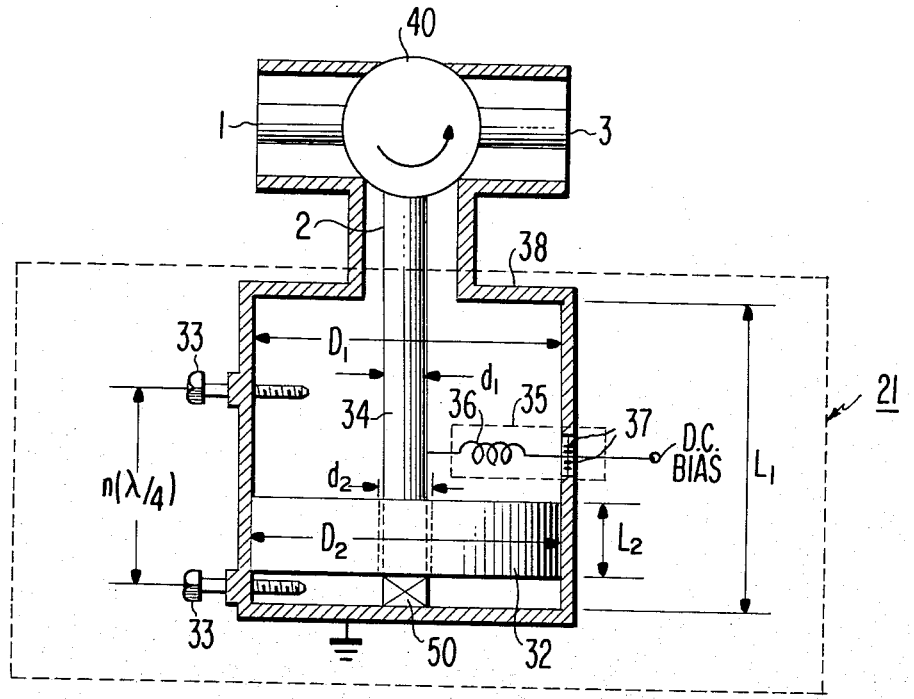
FIG. 3 is a schematic diagram of a frequency divider circuit used in an embodiment of the invention.

Referring to FIG. 3, there is shown a more detailed schematic of the frequency divider circuit 21 shown in FIG. 2. For purpose of illustration and not limitation, a three port circulator 40 is shown as means for coupling an input microwave signal at frequency $f_1$ from circulator port 1 to divider circuit 21 connected to circulator port 2. Circulator 40 also provides a non-reciprocal conductive path for divider circuit 21 output signals from circulator port 2 to a load, not shown, terminating circulator ports. A packaged bulk type semiconductor Transfer Electron Device or TED 50, such as those devices described in a series of papers in the January 1966 issue of the IEEE Transactions on Electron Devices, Vol. Ed-13, No. 1, is included in coaxial cavity 21. One end of TED 50 is connected to center conductor 34 and the opposite end of TED 50 is connected to outer conductor 38. As disclosed by Narayan in the previously cited U.S. application, Ser. No. 325,071, TED 50 may be dimensionally arranged to oscillate at a frequency, $f_2$, which is a subharmonic of the input signal frequency, $f_1$, in response to a combination of the microwave input signal and a D.C. bias voltage having a magnitude just below a threshold voltage, $V_T$, necessary for TED 50 operation but above a TED 50 domain sustaining voltage. The magnitude of the microwave input signal is chosen to increase the magnitude of a TED 50 internal electric field established by the D.C. bias voltage to an internal electric field magnitude which exceeds the threshold field needed to form domains within TED 50 and cause TED 50 to operate. For example, TED 50 may be triggered into oscillating at 4.5 GHz in response to a combination of a 10 milliwatt input microwave signal at 9.0 GHz and a 6.5 volt D.C. signal where 6.5 volts is less than a critical threshold voltage, $V_T$, the minimum voltage which is necessary for TED 50 oscillation. Thus, the dimensions of TED 50 are chosen to permit oscillation at 4.5 GHz in response to a D.C. bias voltage having a magnitude less than the critical threshold voltage, $V_T$, necessary for TED 50 oscillation but sufficient to maintain TED operation in the presence of an oscillation triggering input microwave signal at 9.0 GHz.

In delay line circuits having a frequency modulated input microwave signal, centered at input frequency $f_1$, it is necessary that coaxial cavity 21 be arranged to match the complex input impedance of TED 50 over the operating range of the input microwave signal and the complex output impedance of TED 50 over the subharmonically related operating range of the output microwave signal.

Coaxial cavity 21 is arranged, as known in the art, to have a ratio of outer conductor inside diameter, $D_1$ to center conductor diameter, $d_1$, and a ratio of cavity length, $L_1$, to outer conductor inside diameter, $D_1$, for minimizing cavity transmission loss or optimizing unloaded cavity Q at the input and output frequencies, 9.0 GHz and 4.5 GHz, respectively. A dielectric disc 32 having a hole in its center with a hole diameter, $d_2$, substantially equal to coaxial center conductor diameter $d_1$ and an outer disc diameter, $D_2$, substantially equal to coaxial outer conductor inside diameter, $D_1$, is slidably mounted inside coaxial cavity 21 for providing an impedance transformation from the characteristic impedance of the coaxial cavity to the relatively low impedance of TED 50 at the input and output frequencies, 9.0 GHz and 4.5 GHz, respectively.

Tuning screws 33 are inserted into coaxial cavity 21 and arranged to react electrically with disc 32 in providing an optimum reactance necessary for efficient TED 50 oscillation. As an example, tuning screws 33 are separated from each other by an electrical distance of $n(\lambda/4)$ where n is an odd integer (three) and $\lambda$ is the wavelength at 4.5 GHz in coaxial cavity 21 and the length or thickness, $L_2$, of disc 32 is $\lambda/4$, where $\lambda$ is the wavelength at 4.5 GHz in coaxial cavity 21. It should be noted that the complex input impedance of TED 50 at 9.0 GHz is not necessarily equal to the complex output impedance of TED 50 at 4.5 GHz. Thus, the penetration of tuning screws 32 into coaxial cavity 21 and the position of disc 32 relative to TED 50 and tuning screws 32 are empirically determined for optimum TED 50 generation of signals at a frequency centered at 4.5 GHz in response to a frequency modulated input signal centered at 9.0 GHz.

The D.C. bias signal from a source, not shown, is coupled to center conductor 34 and TED 50 via biasing circuit 35 arranged to provide a relatively high impedance to microwave signals and a relatively low impedance to D.C. voltage signals. As an example, biasing circuit 35 comprises a relatively high inductance lead 36 having one end connected to center conductor 34 and another end capacitively coupled to ground potential through a suitable by-pass capacitor 37.

In summary, a delay line circuit 10 and 30 is described in FIGS. 1 and 2 embodying the present invention in which a frequency divider circuit 11 and 21 having a TED 50 is used to convert an input signal at a first frequency to an output signal at a second frequency which is within the operating band of an acoustic delay device 12 and 22. The delayed output signal from the acoustic delay device is then coupled to a frequency multiplier 13 and 24 which generates a multiplier output signal at the same frequency as the frequency of the input signal coupled to frequency divider circuit 11 and 21. It should now be appreciated that unlike prior art delay line circuits using a frequency down-converter requiring a local oscillator signal, frequency divider circuit 11 and 21 use only a suitably biased TED 50.

It will be further understood that the delay line circuit according to the present invention is not limited to a divide-by-two circuit and frequency doubler, but applies equally as well to divide-by-n circuits using a TED, where $n$ is an integer including one.

What is claimed is:

1. A delay line comprising:
   a frequency divider means having a semiconductor device exhibiting a negative resistance current-voltage characteristic in response to both a D.C. bias signal and a microwave input signal at frequency $f_1$ for converting said input signal to an output signal at frequency, $f_2$, subharmonically related to said frequency $f_1$;
   means for coupling to said semiconductor device a D.C. bias signal having a magnitude less than a critical magnitude, $V_T$, necessary for operating said semiconductor device;
   means for coupling to said semiconductor device said microwave input signal, whereby said semiconductor device converts said input signal to an output signal at frequency $f_2$, subharmonically related to said frequency $f_1$;
   a delay device for providing a predetermined delay for said frequency divider output signal;
   means for coupling said frequency divider circuit to said delay device; and
   a frequency multiplier means coupled to said delay device for multiplying said frequency, $f_2$, of said delayed frequency divider output signal from said delay device to said frequency, $f_1$, of said microwave input signal.

2. A delay line according to claim 1, wherein said semiconductor device is a three terminal transfer electron device.

3. A delay line according to claim 1, wherein said semiconductor device is a two terminal transfer electron device.

4. A delay line according to claim 1, wherein said delay device is a two port surface wave acoustic device.

5. A delay line according to claim 1, wherein said delay device is a one port bulk wave acoustic device.

6. A delay line according to claim 1, wherein said coupling means include circulator means for providing a first non-reciprocal conductive path for said output signal from said frequency divider means to said delay device and a second non-reciprocal conductive path for said delayed frequency divider output signal from said delay device to said frequency multiplier means.

* * * * *